United States Patent

Chao

[11] Patent Number: 6,091,103
[45] Date of Patent: Jul. 18, 2000

[54] INTEGRATED ELECTRICALLY ADJUSTABLE ANALOG TRANSISTOR DEVICES HAVING MULTIPLE DEVICE SUB-STRUCTURES AND METHODS THEREFOR

[76] Inventor: Robert L. Chao, 14555 Harvard Ct., Los Altos, Calif. 94022

[21] Appl. No.: 09/035,507

[22] Filed: Mar. 5, 1998

[51] Int. Cl.[7] .............................. H01L 29/78; H01L 33/00
[52] U.S. Cl. ............................................. 257/318; 257/401
[58] Field of Search ..................................... 257/318, 401

[56] References Cited

U.S. PATENT DOCUMENTS

| | | |
|---|---|---|
| 4,425,631 | 1/1984 | Adam . |
| 5,309,009 | 5/1994 | Chao . |
| 5,359,226 | 10/1994 | DeJong . |
| 5,442,209 | 8/1995 | Chung . |
| 5,668,392 | 9/1997 | Huang et al. . |
| 5,942,786 | 8/1999 | Sheu et al. . |

*Primary Examiner*—Stephen D. Meier
*Attorney, Agent, or Firm*—Jeffrey Weiss; Harry M. Weiss; Harry M. Weiss & Associates, P.C.

[57] ABSTRACT

An improved integrated electrically adjustable analog transistor device is delineated wherein the device has multiple sub-structures to optimize performance of the device. One of the sub-structures is particularly well suited for charging the device's insulated gate. Additional sub-structures, each different in dimensions and electrical characteristics from the first sub-structure, are implemented for optimal use with an external electrical circuit.

5 Claims, 1 Drawing Sheet

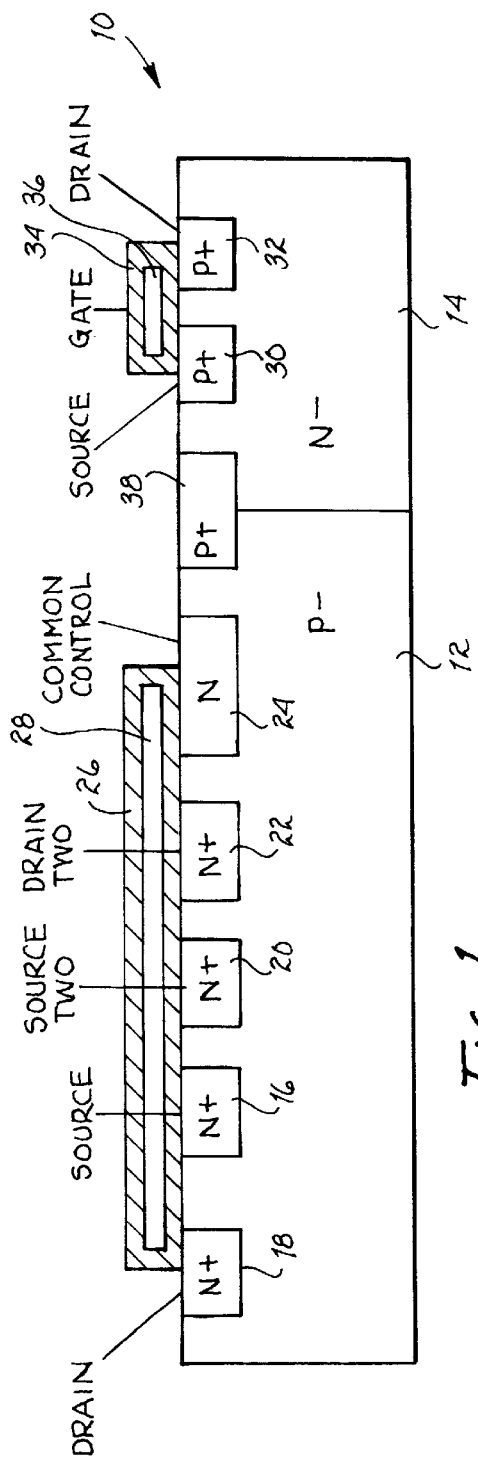
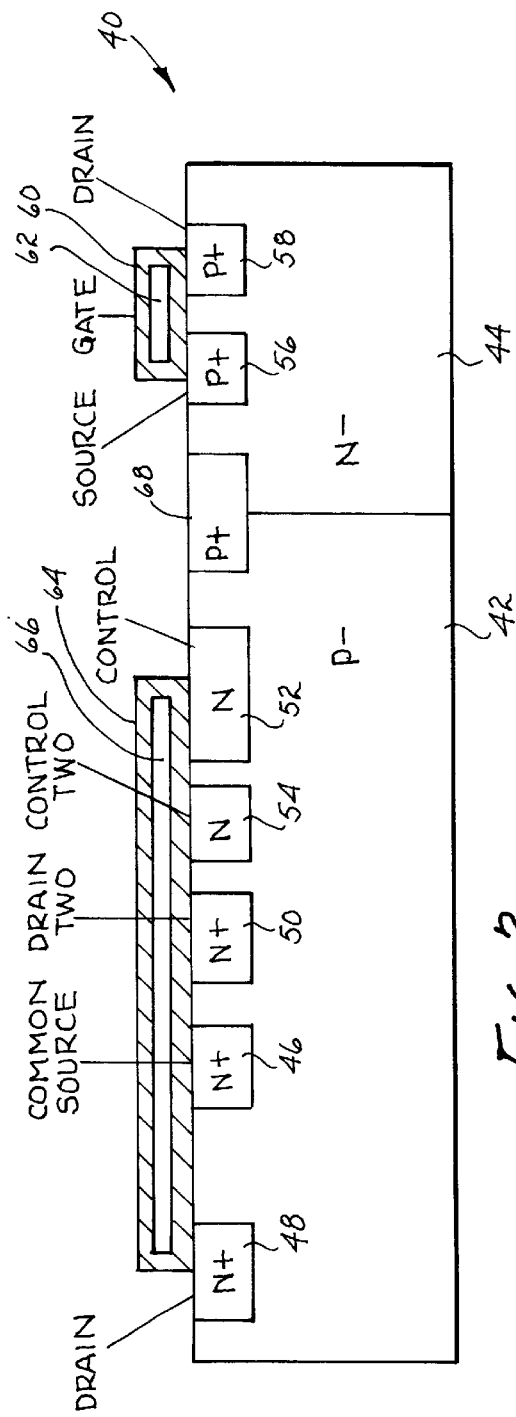

INTEGRATED ELECTRICALLY ADJUSTABLE ANALOG TRANSISTOR DEVICES HAVING MULTIPLE DEVICE SUB-STRUCTURES AND METHODS THEREFOR

RELATED APPLICATION

This patent application is related to issued U.S. Pat. No. 5,309,009 entitled "Integrated Electrically Adjustable Analog Transistor Device," in the name of the same inventor, and is incorporated herein by reference.

BACKGROUND OF THE INVENTION

1. Field of the Invention

This invention is in the field of analog transistor devices and methods therefor and, more particularly, is a number of different integrated electrically adjustable analog transistor devices, each having multiple device sub-structures, and methods therefor.

2. Description of the Related Art

U.S. Pat. No. 5,309,009, entitled "Integrated Electrically Adjustable Analog Transistor Device" and filed in the name of the inventor of the present invention shows an integrated electrically adjustable transistor device wherein the user sets the voltage on the insulated gate of the analog MOS transistor device by injection of energized electrical charge into the insulated gate. Thereafter, this charge is substantially retained on the insulated gate of the analog MOS transistor device for subsequent application where the user utilizes the analog MOS transistor device in an electrical circuit. For many applications, the structure of the analog MOS transistor device required for optimal use in an electrical circuit is vastly different from the structure of the analog MOS transistor device required for efficient charge injection into the insulated gate structure of the analog MOS transistor device. It would be highly advantageous to provide an analog MOS transistor device having a first device sub-structure for optimal use in charge injection into the insulated gate structure of the analog MOS transistor device, while having one or more separate device sub-structure(s), with dimensions and electrical characteristics different than the first device sub-structure, for optimal use in an external electrical circuit.

Therefore, there existed a need to provide such an improved integrated electrically adjustable analog MOS transistor device having such a plurality of device sub-structures to optimize both in the charging of the device's insulated gate and in incorporation of the device with an external electrical circuit.

SUMMARY OF THE INVENTION

An object of the present invention is to provide an improved integrated electrically adjustable analog MOS transistor device having a plurality of device sub-structures to optimize both in the charging of the device's insulated gate and in incorporation of the device with an external electrical circuit.

Another object of the present invention is to provide an improved method of operating an integrated electrically adjustable analog MOS transistor device having a plurality of device sub-structures to optimize both in the charging of the device's insulated gate and in incorporation of the device with an external electrical circuit.

BRIEF DESCRIPTION OF THE PREFERRED EMBODIMENTS

According to one embodiment of the present invention, an MOS integrated circuit is disclosed comprising, in combination, a semiconductor substrate having a surface; a first region of a first conductivity type located in the substrate and in contact with the surface; second and third regions of a second conductivity type opposite the first conductivity type located in the first region in the substrate and in contact with the surface, wherein the second and third regions form a source and a drain, respectively, for a first MOS transistor; and fourth and fifth regions of the second conductivity type located in the first region in the substrate and in contact with the surface, wherein the fourth and fifth regions form a source and a drain, respectively, for a second MOS transistor having dimensions and electrical characteristics different than those for the first MOS transistor. This embodiment of the circuit further includes a sixth region of the second conductivity type located in the first region in the substrate and in contact with the surface, wherein the sixth region has a lower doping concentration than any of the second, third, fourth, and fifth regions, and wherein the sixth region forms a control junction shared between the first and second MOS transistors.

Additionally, this embodiment of the circuit includes a seventh region of the second conductivity type located in the substrate and in contact with the surface, wherein the seventh region has a lower doping concentration than the sixth region; and eighth and ninth regions of the first conductivity type located in the seventh region in the substrate and in contact with the surface, wherein the eighth and ninth regions form a source and drain, respectively, of a third MOS transistor of complimentary conductivity type to the first and second MOS transistors. This embodiment of the circuit further includes an insulating gate layer of substantially uniform thickness over each of the seventh, eighth, and ninth regions; and a conductive gate within the insulating gate layer and spanning over each of the seventh, eighth, and ninth regions. Also provided in this embodiment of the circuit are an insulating gate layer of substantially uniform thickness over each of the first, second, third, fourth, fifth, and sixth regions; conductive means coupled to the sixth region for controlling voltage on the control junction; and conductive gate means within the insulating gate layer and spanning over the first, second, third, fourth, fifth, and sixth regions for controlling a first threshold of the first MOS transistor by a first combination of voltage on the control junction and charge injected at the drain of the first MOS transistor, and for controlling a second threshold of the second MOS transistor by a second combination of voltage on the control junction and charge injected at at least one of the drain of the first MOS transistor and the drain of the second MOS transistor. Lastly, a method of operation for the above-identified embodiment of the circuit is disclosed to establish another version of the instant invention.

According to yet another embodiment of the present invention, an MOS integrated circuit is disclosed comprising, in combination, a semiconductor substrate having a surface; a first region of a first conductivity type located in the substrate and in contact with the surface; second and third regions of a second conductivity type opposite the first conductivity type located in the first region in the substrate and in contact with the surface, wherein the second and third regions form a source and a drain, respectively, for a first MOS transistor; and a fourth region of the second conductivity type located in the first region in the substrate and in contact with the surface, wherein the second and fourth regions form a source and a drain, respectively, for a second MOS transistor having dimensions and electrical characteristics different than those for the first MOS transistor. This embodiment of the circuit further includes fifth and sixth regions of the second conductivity type located in the first region in the substrate and in contact with the surface, wherein the fifth and sixth regions have a lower doping concentration than any of the second, third, and fourth regions, and wherein the fifth and sixth regions form a first control junction and a second control junction for the first and second MOS transistors.

Additionally, this embodiment of the circuit includes a seventh region of the second conductivity type located in the substrate and in contact with the surface, wherein the seventh region has a lower doping concentration than the fifth and sixth regions; and eighth and ninth regions of the first conductivity type located in the seventh region in the substrate and in contact with the surface, wherein the eighth and ninth regions form a source and drain, respectively, of a third MOS transistor of complimentary conductivity type to the first and second MOS transistors. This embodiment of the circuit further includes an insulating gate layer of substantially uniform thickness over each of the seventh, eighth, and ninth regions; and a conductive gate within the insulating gate layer and spanning over each of the seventh, eighth, and ninth regions. Moreover, this embodiment of the circuit includes an insulating gate layer of substantially uniform thickness over each of the first, second, third, fourth, fifth, and sixth regions; conductive means coupled to the fifth and sixth regions for controlling voltage on the first and second control junctions, respectively; and conductive gate means within the insulating gate layer and spanning over the first, second, third, fourth, fifth, and sixth regions for controlling a first threshold of the first MOS transistor by a first combination of voltage on at least one of the first control junction and the second control junction and charge injected at the drain of the first MOS transistor, and for controlling a second threshold of the second MOS transistor by a second combination of voltage on at least one of the first control junction and the second control junction and charge injected at at least one of the drain of the first MOS transistor and the drain of the second MOS transistor. Similarly, a method of operation for the above-identified third embodiment of the circuit is disclosed to establish a fourth version of the instant invention.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 1 is a simplified layout view of one embodiment of the present invention.

FIG. 2 is a simplified layout view of another embodiment of the present invention.

DESCRIPTION OF THE PREFERRED EMBODIMENTS

Before commencing the detailed description of the drawings showing the present invention, the relationship between the related application (noted above) and the present invention should be pointed out. Specifically, the related application disclosed an integrated electrically adjustable analog transistor device, and the present invention does so as well; however, the present invention advances beyond what was shown by the related application. In particular, it has been noted that the instant invention provides integrated electrically adjustable analog transistor devices, each having multiple sub-structures. One of the "sub-structures" of the present invention is substantially similar to that disclosed for the related application, and that substructure is particularly well suited for charging the device's insulated gate. Moreover, the present invention includes one or more additional sub-structures, each different in dimensions and electrical characteristics from the first sub-structure, for optimized use with an external electrical circuit. This unique design approach was necessitated by the fact that oftentimes the dimensions and electrical characteristics required for optimum charging (i.e., those for the first sub-structure) are not the appropriate size and electrical characteristics as would be required for optimum implementation of the device with an external electrical circuit. Thus, the present invention provides a device having one sub-structure having dimensions and electrical characteristics optimum for device charging (e.g., as in the related application), and one or more additional substructures having sizes and electrical characteristics (more than likely different than those for the first sub-structure) selected for optimum use with an external electrical circuit.

Now turning to the Figures, FIG. 1 shows one embodiment of the present invention generally designated by reference number 10. Note that while the title of the present invention refers to this and other embodiments as integrated electrically adjustable analog transistor devices, each having multiple sub-structures, a more simplified phrase referring to the devices of the present invention is an MOS integrated circuit. The MOS integrated circuit 10 of FIG. 1 comprises, in combination, a semiconductor substrate (elements 12 and 14 collectively) having a surface (e.g., the upper surface of the substrate); a first region 12 of a first conductivity type located in the substrate and in contact with the surface; second 16 and third 18 regions of a second conductivity type opposite the first conductivity type located in the first region 12 in the substrate and in contact with the surface, wherein the second 16 and third 18 regions form a source 16 and a drain 18, respectively, for a first MOS transistor; and fourth 20 and 22 fifth regions of the second conductivity type located in the first region 12 in the substrate and in contact with the surface, wherein the fourth 20 and 22 fifth regions form a source 20 and a drain 22, respectively, for a second MOS transistor. The first and second MOS transistors have different dimensions and electrical characteristics such that the first is optimized for charging of the device 10, while the second (an others if so implemented) are optimal for use with an external electrical circuit (not shown). Note that the previously mentioned term, "sub-structures," refers to the first and second MOS transistors. Also, kindly note that it is understood that more than two of such sub-structures could be implemented into any embodiment of the present invention. At a minimum though, one of the sub-structures (i.e., MOS transistors) would be optimally selected for charging, while one or more other sub-structures (i.e., MOS transistors) would be optimally sized and designed for use with the requirements of an external electrical circuit. A sixth region 24 of the second conductivity type is located in the first region 12 in the substrate and in contact with the surface. The sixth region 24 has a lower doping concentration than any of the second 16, third 18, fourth 20, and fifth 22 regions, and the sixth region 24 forms a control junction 24 shared between the first and second MOS transistors. So in FIG. 1, by way of example, the N-channel device comprises the P– region 12, the N+ source region 16 for the first MOS transistor, the N+ drain region 18 for the first MOS transistor, the N+ source region 20 for the second MOS transistor, the N+ drain region 22 for the second MOS transistor, the N+ control region 24 shared between the first and second MOS transistors, an insulating layer 26, and a gate 28.

The P-channel device includes a seventh region 14 of the second conductivity type located in the substrate and in contact with the surface, wherein the seventh region 14 has a lower doping concentration than the sixth region 24; and eighth 30 and ninth 32 regions of the first conductivity type located in the seventh region 14 in the substrate and in contact with the surface, wherein the eighth 30 and ninth 32 regions form a source 30 and drain 32, respectively, of a third MOS transistor of complimentary conductivity type to the first and second MOS transistors. The P-channel device also includes an insulating gate layer 34 of substantially uniform thickness over each of the seventh 14, eighth 30, and ninth 32 regions, and a conductive gate 36 within the insulating gate layer 34 and spanning over each of the seventh 14, eighth 30, and ninth 32 regions. Thus, by way of example, the P-channel device includes the N− region 14, the P+ source region 30 for the third MOS transistor, the P+ drain region 32 for the third MOS transistor, the insulating layer 34, and the gate 36.

Returning the focus to the N-channel device, it further includes an insulating gate layer 26 of substantially uniform thickness over each of the first 12, second 16, third 18, fourth 20, fifth 22, and sixth 24 regions, a conductive portion (not explicitly shown) coupled to the sixth region 24 for controlling voltage on the control junction 24, and a conductive gate portion 28 within the insulating gate layer 26 and spanning over the first 12, second 16, third 18, fourth 20, fifth 22, and sixth 24 regions for controlling a first threshold of the first MOS transistor by a first combination of voltage on the control junction 24 and charge injected at the drain 18 of the first MOS transistor, and for controlling a second threshold of the second MOS transistor by a second combination of voltage on the control junction 24 and charge injected at the drain 18 of the first MOS transistor. Additionally, note that there is a P+ junction isolation region 38.

Digressing momentarily, note that the gate 28 is wide enough to span not only the source and drain junctions of the first 16 and 18 and second 20 and 22 MOS transistors, respectively, but it also covers a portion of the shared control junction 24. This allows a conductor (not explicitly shown) coupled to the control junction 24 to capacitively control the gate voltage of the N-channel portion of the device 10 (i.e., the voltage of the first and second MOS transistors). In addition, the gate 28 is completely insulated from other conductors, with the only connection being capacitive coupling to the source junctions 16 and 20, the drain junctions 18 and 22, and the control junction 24.

The transistor channel characteristics of the N-channel portion of the device 10 (i.e., for the first and second MOS transistors) are determined by two factors: the charge level on the insulated gate 28, and the voltage impressed on the control junction 24. The charge level of gate 28 is changed by injecting charge at the drain junctions 18 or 22, but preferably only drain junction 18. The gate 28 and insulating layer 26 are constructed such that the charge on gate 28 remains at a constant level substantially indefinitely, or until a user injects or removes charge again. In this way, a user can set the appropriate charge level on gate 28 prior to using the device 10, and then control the N-channel portion of the device 10 using the control junction 24. Thus, each substructure (i.e., the first and second MOS transistors) is affected by substantially similar factors in establishing their threshold operational characteristics; however, since the dimensions and electrical characteristics of the plurality of sub-structures are different in order to accomplish different goals, while the factors affecting operational thresholds for the substructures may be substantially similar, the actual operational thresholds differ in practice. Those skilled in the art understand what constitutes optimum size and electrical characteristics for the sub-structures to accomplish their respective goals. In other words, those skilled in the art understand the size and electrical characteristics required of a sub-structure optimized for charging of the device 10, and depending upon the requirements of an electrical circuit, within which the present invention is incorporated, the size and electrical characteristics required of the other substructure(s) for optimal use with those requirements.

Note that in FIG. 1, only the N-channel portion of the device 10 is shown as having a plurality of different substructures; however, those skilled in the art realize that the P-channel portion, rather than the N-channel portion, could be implemented to have a plurality of different substructures. Similarly, both portions of the device 10 could, if desired, be designed to each have a plurality of different sub-structures. Lastly, note that fabrication of this, and other, embodiments of the present invention can be implemented using conventional MOS fabrication materials and methods well known to those skilled in the art. Moreover, other features and general operational theory associated with this, and other, embodiments of the instant invention are well known to those skilled in the art.

Referring now to FIG. 2, another embodiment of the present invention is shown generally designated by reference number 40. The MOS integrated circuit 40 of FIG. 2 comprises, in combination, a semiconductor substrate (elements 42 and 44 collectively) having a surface (e.g., the upper surface of the substrate); a first region 42 of a first conductivity type located in the substrate and in contact with the surface; second 46 and third 48 regions of a second conductivity type opposite the first conductivity type located in the first region 42 in the substrate and in contact with the surface, wherein the second 46 and third 48 regions form a source 46 and a drain 48, respectively, for a first MOS transistor; and a fourth region 50 of the second conductivity type located in the first region 42 in the substrate and in contact with the surface, wherein the second 46 and fourth 50 regions form a source 46 and a drain 50, respectively, for a second MOS transistor. The first and second MOS transistors have different dimensions and electrical characteristics such that the first is optimized for charging of the device 40, while the second (an others if so implemented) are optimal for use with an external electrical circuit (not shown). Note that at a minimum, one of the sub-structures (i.e., MOS transistors) would be optimally selected for charging, while one or more other sub-structures (i.e., MOS transistors) would be optimally sized and designed for use with the requirements of an external electrical circuit. Also provided are fifth 52 and sixth 54 regions of the second conductivity type located in the first region 42 in the substrate and in contact with the surface, wherein the fifth 52 and 54 sixth regions have a lower doping concentration than any of the second 46, third 48, and fourth 50 regions, and wherein the fifth 52 and sixth 54 regions form a first control junction 52 and a second control junction 54 for the first and second MOS transistors. So in FIG. 2, by way of example, the N-channel device comprises the P− region 42, the N+ source region 46 for the first and second MOS transistors, the N+ drain region 48 for the first MOS transistor, the N+ drain region 50 for the second MOS transistor, the N+ control region 52, the N+ control region 54 forming a first control gate and a second control gate for both the first and second MOS transistors, an insulating layer 64, and a gate 66.

The P-channel device includes a seventh region 44 of the second conductivity type located in the substrate and in contact with the surface, wherein the seventh region 44 has a lower doping concentration than the fifth 52 and sixth 54 regions; and eighth 56 and ninth 58 regions of the first conductivity type located in the seventh region 44 in the substrate and in contact with the surface, wherein the eighth 56 and ninth 58 regions form a source 56 and drain 58, respectively, of a third MOS transistor of complimentary conductivity type to the first and second MOS transistors. The P-channel device also includes an insulating gate layer 60 of substantially uniform thickness over each of the seventh 44, eighth 56, and ninth 58 regions, and a conductive gate 62 within the insulating gate layer 60 and spanning over each of the seventh 44, eighth 56, and ninth 58 regions. Thus, by way of example, the P-channel device includes the N− region 44, the P+ source region 56 for the third MOS transistor, the P+ drain region 58 for the third MOS transistor, the insulating layer 60, and the gate 62.

Returning the focus to the N-channel device, it further includes an insulating gate layer 64 of substantially uniform thickness over each of the first 42, second 46, third 48, fourth 50, fifth 52, and sixth 54 regions, a conductive portion (not explicitly shown) coupled to the fifth 52 and sixth 54 regions for controlling voltage on the first 52 and second 54 control junctions, respectively, and a conductive gate portion 66 within the insulating gate layer 64 and spanning over the first 42, second 46, third 48, fourth 50, fifth 52, and sixth 54 regions for controlling a first threshold of the first MOS transistor by a first combination of voltage on the first or second control junctions 52 and 54 and charge injected at the drain 48 of the first MOS transistor, and for controlling a second threshold of the second MOS transistor by a second combination of voltage on the control junctions 52 and 54 and charge injected at the drain 48 of the first MOS transistor. Additionally, note that there is a P+ junction isolation region 68.

Once again, note that the gate 66 is wide enough to span the control junctions 52 and 54. This allows a conductor (not explicitly shown) coupled to the control junctions 52 and 54 to control the gate voltage of the N-channel portion of the device 40 (i.e., the voltage of the first and second MOS transistors). In addition, the gate 66 is completely insulated from other conductors, with the only connection being capacitive coupling to the source junction 46, the drain junctions 48 and 50, and the control junctions 52 and 54.

The transistor channel characteristics of the N-channel portion of the device 40 (i.e., for the first and second MOS transistors) are determined by two factors: the charge level on the insulated gate 66, and the voltage impressed on the control junctions 52 and 54. The charge level of gate 66 is changed by injecting charge at the drain junction 48. The gate 66 and insulating layer 64 are constructed such that the charge on gate 66 remains at a constant level substantially indefinitely, or until a user injects or removes charge again. In this way, a user can set the appropriate charge level on the gate 66 prior to using the device 40, and then control the N-channel portion of the device 40 using the control junctions 52 and 54. Thus, each sub-structure (i.e., the first and second MOS transistors) is affected by substantially similar factors in establishing their threshold operational characteristics; however, since the dimensions and electrical characteristics of the plurality of sub-structures are different in order to accomplish different goals, while the factors affecting operational thresholds for the sub-structures may be substantially similar, the actual operational thresholds differ in practice. Those skilled in the art understand what constitutes optimum size and electrical characteristics for the sub-structures to accomplish their respective goals. In other words, those skilled in the art understand the size and electrical characteristics required of a sub-structure optimized for charging of the device 40, and depending upon the requirements of an electrical circuit, within which the present invention is incorporated, the size and electrical characteristics required of the other sub-structure(s) for optimal use with those requirements.

Note that in FIG. 2, only the N-channel portion of the device 40 is shown as having a plurality of different sub-structures; however, those skilled in the art realize that the P-channel portion, rather than the N-channel portion, could be implemented to have a plurality of different sub-structures. Similarly, both portions of the device 40 could, if desired, be designed to each have a plurality of different sub-structures.

Although the invention has been particularly shown and described with reference to a preferred embodiment thereof, it will be understood by those skilled in the art that changes in form and detail may be made therein without departing from the spirit and scope of the invention. For example, the term "MOS" used herein may comprise any of CMOS, NMOS, or PMOS type devices.

What is claimed is:

1. An MOS integrated circuit comprising, in combination:
   a semiconductor substrate having a surface;
   a first region of a first conductivity type located in said substrate and in contact with said surface
   second and third regions of a second conductivity type opposite said first conductivity type located in said first region in said substrate and in contact with said surface, said second and third regions forming a source and a drain, respectively, for a first MOS transistor;
   fourth and fifth regions of said second conductivity type located in said first region in said substrate and in contact with said surface, said fourth and fifth regions forming a source and a drain, respectively, for a second MOS transistor having dimensions and electrical characteristics different than those for said first MOS transistor;
   a sixth region said second conductivity type located in said first region in said substrate and in contact with said surface, said sixth region having a lower doping concentration than any of said second, third, fourth, and fifth regions, and said sixth region forming a control junction shared between said first and second MOS transistors;
   an insulating gate layer of substantially uniform thickness over each of said first, second, third, fourth, fifth, and sixth regions;
   conductive means coupled to said sixth region for controlling voltage on said control junction; and
   conductive gate means within said insulating gate layer and spanning over said first, second, third, fourth, fifth, and sixth regions for controlling a first threshold of said first MOS transistor by a first combination of voltage on said control junction and charge injected at said drain of said first I\40S transistor, and for controlling a second threshold of said second MOS transistor by a second combination of voltage on said control junction and charge injected at—at least one of said drain of said first MOS transistor and said drain of said second MOS transistor.

2. The circuit of claim 1 further including:
   a seventh region of said second conductivity type located in said substrate and in contact with said surface, said seventh region having a lower doping concentration than said sixth region; and eighth and ninth regions of said first conductivity type located in said seventh region in said substrate and in contact with said surface, said eighth and ninth regions forming a source and drain, respectively, of a third MOS transistor of complimentary conductivity type to said first and second MOS transistors.

3. An MOS integrated circuit comprising, in combination:

a semiconductor substrate having a surface;

a first region of a first conductivity type located in said substrate and in contact with said surface second and third regions of a second conductivity type opposite said first conductivity type located in said first region in said substrate and in contact with said surface, said second and third regions forming a source and a drain, respectively, for a first MOS transistor;

fourth and fifth regions of said second conductivity type located in said first region in said substrate and in contact with said surface, said fourth and fifth regions forming a source and a drain, respectively, for a second MOS transistor having dimensions and electrical characteristics different than those for said first MOS transistor;

a sixth region said second conductivity type located in said first region in said substrate and in contact with said surface, said sixth region having a lower doping concentration than any of said second, third, fourth, and fifth regions, and said sixth region forming a control junction shared between said first and second MOS transistors;

a seventh region of said second conductivity type located in said substrate and in contact with said surface, said seventh region having a lower doping concentration than said sixth region;

eighth and ninth regions of said first conductivity type located in said seventh region in said substrate and in contact with said surface, said eighth and ninth regions forming a source and drain, respectively, of a third MOS transistor of complimentary conductivity type to said first and second MOS transistors;

an insulating gate layer of substantially uniform thickness over each of said seventh, eighth, and ninth regions; and a conductive gate within said insulating gate layer and spanning over each of said seventh, eighth, and ninth regions.

4. An MOS integrated circuit comprising, in combination:

a semiconductor substrate having a surface;

a first region of a first conductivity type located in said substrate and in contact with said surface second and third regions of a second conductivity type opposite said first conductivity type located in said first region in said substrate and in contact with said surface, said second and third regions forming a source and a drain, respectively, for a first MOS transistor;

a fourth region of said second conductivity type located in said first region in said substrate and in contact with said surface, said second and fourth regions forming a source and a drain, respectively, for a second MOS transistor having dimensions and electrical characteristics different than those for said first MOS transistor;

fifth and sixth regions of said second conductivity type located in said first region in said substrate and in contact with said surface, said fifth and sixth regions having a lower doping concentration than any of said second, third, and fourth regions, and said fifth and sixth regions forming a first control junction and second control junction for said first MOS transistor and for said second MOS transistor;

a seventh region of said second conductivity type located in said substrate and in contact with said surface, said seventh region having a lower doping concentration than said fifth and sixth regions;

eighth and ninth regions of said first conductivity type located in said seventh region in said substrate and in contact with said surface, said eighth and ninth regions forming a source and drain, respectively, of a third MOS transistor of complimentary conductivity type to said first and second MOS transistors;

an insulating gate layer of substantially uniform thickness over each of said seventh, eighth, and ninth regions; and a conductive gate within said insulating gate layer and spanning over each of said seventh, eighth, and ninth regions.

5. The circuit of claim 4 further including:

an insulating gate layer of substantially uniform thickness over each of said first, second, third, fourth, fifth, and sixth regions;

conductive means coupled to said fifth and sixth regions for controlling voltage on said first and second control junctions, respectively: and conductive gate means within said insulating gate layer and spanning over said first, second, third, fourth, fifth, and sixth regions for controlling a first threshold of said first MOS transistor by a first combination of voltage on at least one of said first control junction and said second control junction and charge injected at said drain of said first MOS transistor, and for controlling a second threshold of said second MOS transistor by a second combination of voltage on at least one of said first control junction and said second control junction and charge injected at—at least one of said drain of said first MOS transistor and said drain of said second MOS transistor.

* * * * *